US012701715B2

(12) United States Patent
Park et al.

(10) Patent No.: US 12,701,715 B2
(45) Date of Patent: Aug. 4, 2026

(54) SEMICONDUCTOR MEMORY DEVICE

(71) Applicant: Samsung Electronics Co., Ltd.,
Suwon-si (KR)

(72) Inventors: Jungmin Park, Suwon-si (KR);
Ji-Sung Kim, Suwon-si (KR); Hanjin Lim, Suwon-si (KR); Hyungsuk Jung,
Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 474 days.

(21) Appl. No.: 18/495,038

(22) Filed: Oct. 26, 2023

(65) Prior Publication Data

US 2024/0315045 A1 Sep. 19, 2024

(30) Foreign Application Priority Data

Mar. 16, 2023 (KR) ........................ 10-2023-0034677

(51) Int. Cl.
_H10B 53/30_ (2023.01)

(52) U.S. Cl.
CPC ..................................... _H10B 53/30_ (2023.02)

(58) Field of Classification Search
CPC ...... H10B 53/30; H10B 12/315; H10B 12/34;
H10B 12/488; H10B 12/033; H10B
12/482; H10D 1/684
USPC ...................................................... 257/295
See application file for complete search history.

(56) References Cited

U.S. PATENT DOCUMENTS

| | | | |
|---|---|---|---|
| 9,548,300 B2 | 1/2017 | Kim | |
| 9,761,580 B1 | 9/2017 | Ramaswamy | |
| 10,020,360 B1 | 7/2018 | Ramaswamy | |
| 10,586,582 B2 | 3/2020 | Liu et al. | |
| 11,244,952 B2 | 2/2022 | Chhajed et al. | |
| 11,482,529 B2 | 10/2022 | Manipatruni et al. | |
| 2003/0141528 A1* | 7/2003 | Ito ........................... | H10B 53/00 |
| | | | 257/295 |
| 2006/0073616 A1* | 4/2006 | Ohashi ................... | H10D 1/696 |
| | | | 257/E21.664 |
| 2020/0111800 A1 | 4/2020 | Ramaswamy | |

* cited by examiner

_Primary Examiner_ — Norman D Richards
_Assistant Examiner_ — Laura M Dykes
(74) _Attorney, Agent, or Firm_ — Harness, Dickey & Pierce, P.L.C.

(57) ABSTRACT

A semiconductor device may include a substrate including a first impurity region and a second impurity region; a first word line in a region of the substrate with the first impurity region on one side of the first word line and the second impurity region on an other side of the first word line; a bit line connected to the first impurity region; a first conductive pattern connected to the second impurity region; a first partial electrode and a second partial electrode on the first conductive pattern; a first dielectric layer in contact with an upper surface of the first partial electrode and an upper surface of the second partial electrode; and a common electrode on the first dielectric layer. An area of the upper surface of the first partial electrode may be different from an area of the upper surface of the second partial electrode.

20 Claims, 11 Drawing Sheets

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2023-0034677, filed on Mar. 16, 2023 in the Korean Intellectual Property Office, the entire contents of which are hereby incorporated by reference.

BACKGROUND

The present disclosure relates to a semiconductor memory device.

Semiconductor devices are attractive in the electronic industry because of their small size, multi-function, and/or low fabrication costs. However, semiconductor devices have been highly integrated with the development of the electronic industry. Line widths of patterns of the semiconductor devices have been more and more reduced for higher integration of the semiconductor devices. Recently, new and/or more expensive exposure techniques may be required for fine patterns of the semiconductor devices, such that it may be difficult to highly integrate the semiconductor device. Thus, various researches are being conducted for new integration techniques.

SUMMARY

An aspect of the present disclosure is to provide a highly integrated semiconductor memory device capable of multi-bit program operation.

A semiconductor memory device according to an embodiment of the present disclosure may include a substrate, the substrate including a first impurity region and a second impurity region; a first word line in the substrate, the first word line in a region of the substrate with the first impurity region on one side of the first word line and the second impurity region on an other side of the first word line; a bit line connected to the first impurity region; a first conductive pattern connected to the second impurity region; a first partial electrode and a second partial electrode on the first conductive pattern; a first dielectric layer in contact with an upper surface of the first partial electrode and an upper surface of the second partial electrode; and a common electrode on the first dielectric layer. An area of the upper surface of the first partial electrode may be different from an area of the upper surface of the second partial electrode.

A semiconductor memory device according to an embodiment of the present disclosure may include a substrate; a transistor on the substrate; a bit line connected to a first side of the transistor; and a capacitor connected to a second side of the transistor. The capacitor may include a plurality of partial electrodes, a dielectric layer in contact with the plurality of partial electrodes, and a common electrode in contact with the dielectric layer. Areas of the plurality of partial electrodes in contact with the dielectric layer may be different from each other. The dielectric layer may include a single layer structure or a multilayer structure of at least one of a ferroelectric material and an antiferroelectric material.

A semiconductor memory device according to an embodiment of the present disclosure may include a substrate including an active region, a first impurity region, and a second impurity region; a device isolation portion on the substrate, the device isolation portion defining an active region of the substrate; a word line crossing the active region, the word line in a region of the substrate with the first impurity region at one side of the word line and the second impurity region at an other side of the word line; a first interlayer insulating layer covering the substrate; a bit line on the first interlayer insulating layer and connected to the first impurity region; a second interlayer insulating layer covering the bit line and the first interlayer insulating layer; a first conductive pattern on the second interlayer insulating layer and connected to the second impurity region; a first partial electrode and a second partial electrode on the first conductive pattern; an inter-electrode insulating layer between the first partial electrode and the second partial electrode; a dielectric layer in contact with an upper surface of the first partial electrode, an upper surface of the second partial electrode, and an upper surface of the inter-electrode insulating layer; and a common electrode on the dielectric layer. An area of the upper surface of the first partial electrode may be different from an area of the upper surface of the second partial electrode. A thickness of the dielectric layer may be 30 Å to 100 Å. The dielectric layer may include a single layer structure or a multilayer structure of at least one of a ferroelectric material and an antiferroelectric material.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Hereinafter, to explain the present disclosure in more detail, embodiments according to the present disclosure will be described in more detail with reference to the accompanying drawings. In this specification, a 'word line' may be referred to as a 'first conductive line' and a 'bit line' may be referred to as a 'second conductive line'. A 'Bit line contact' may be referred to as a 'first contact', a 'storage node contact' may be referred to as a 'second contact', a 'partial electrode' may be referred to as a 'lower electrode' or a 'landing electrode', and a 'common electrode' may be referred to as an 'upper electrode'.

Figure 1A:
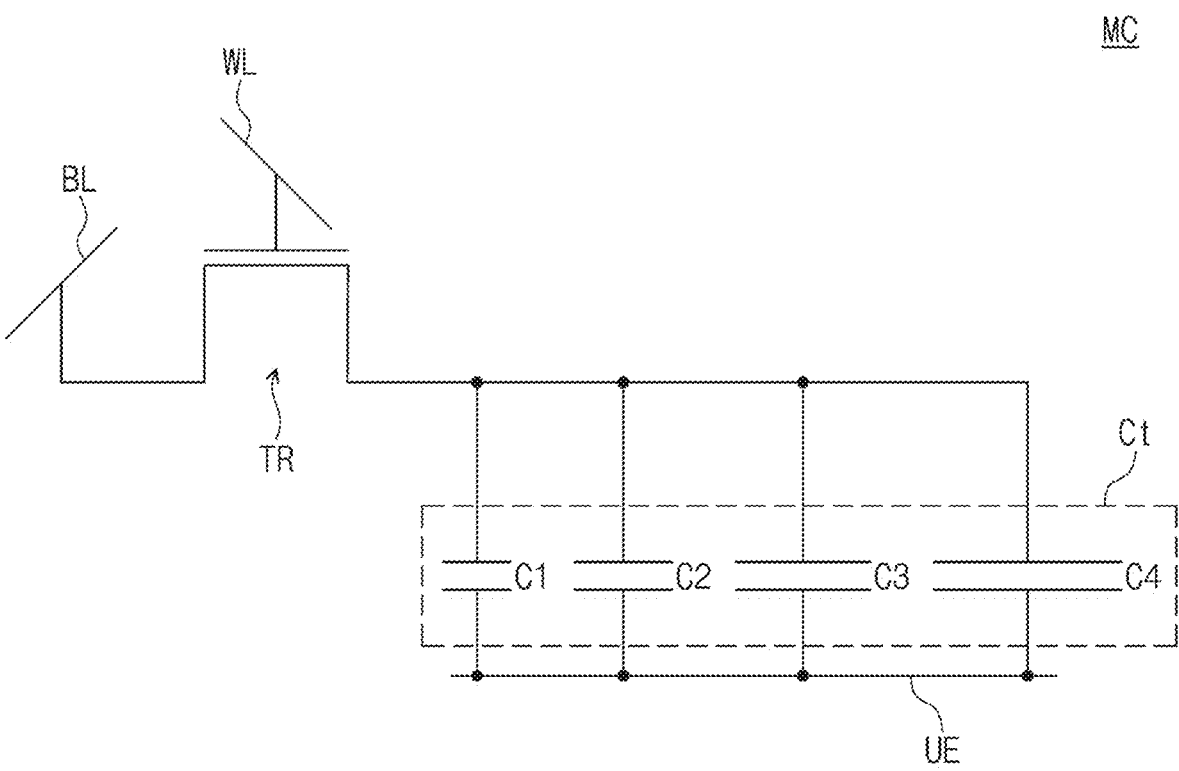
FIG. 1A is a circuit diagram of a semiconductor memory device according to embodiments of the present disclosure.

FIG. 1A is a circuit diagram of a semiconductor memory device according to embodiments of the present disclosure.

Referring to FIG. 1A, a semiconductor memory device according to the present example may be, for example, dynamic random access memory (DRAM). The semiconductor memory device may include a memory cell array in which a plurality of memory cells MC are disposed. In detail, one memory cell MC may include one transistor TR and a capacitor Ct connected to one terminal thereof. A gate of the transistor TR is connected to the word line WL. A bit line BL is connected to the other terminal of the transistor TR. The capacitor Ct may include a plurality of sub-capacitors C1 to C4 having different capacitances. For example, the sub-capacitors C1 to C4 may include the first to fourth sub-capacitors C1 to C4. In this example, the number of sub-capacitors C1 to C4 is four, but is not limited thereto and the number of sub-capacitors C1 to C4 may be two, three, five or more. Interfacial areas of the sub-capacitors C1 to C4 (interfacial areas where a partial electrode and a common electrode face each other) may be different from each other. A dielectric layer of each of the sub-capacitors C1 to C4 may have a single layer or multilayer structure of at least one of a ferroelectric material and an antiferroelectric material.

Figure 1B:
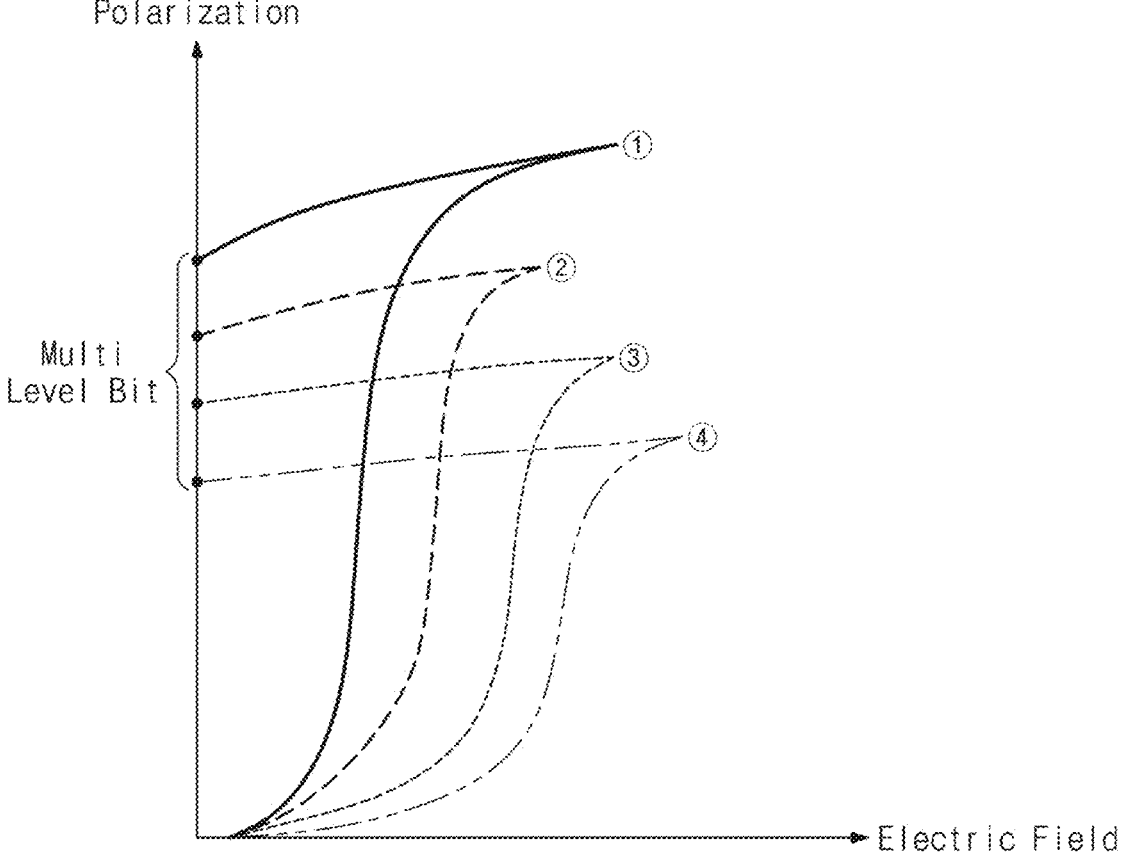
FIG. 1B is a graph showing a degree of polarization depending on an electric field in a dielectric layer of a capacitor of a semiconductor memory device according to embodiments of the present disclosure.

FIG. 1B is a graph showing a degree of polarization depending on an electric field in a dielectric layer of a capacitor of a semiconductor memory device according to embodiments of the present disclosure.

Referring to FIG. 1B, during a program operation of a memory cell MC, electric fields applied to dielectric layers of the sub-capacitors C1 to C4 may vary due to a difference in interfacial areas of the sub-capacitors C1 to C4. Polarization directions of the ferroelectric material and/or anti-ferroelectric material constituting the dielectric layers of the sub-capacitors C1 to C4 may be changed by an electric field. When the same voltage is applied to partial electrodes (corresponding to lower electrodes of the capacitor) of the sub-capacitors C1 to C4, as the interfacial area is smaller, the electric field may be stronger, and as the electric field is stronger, polarization phenomenon may be increased. As a result, the capacitance of each of the sub-capacitors C1 to C4 may vary, and thus, a total capacitance of the capacitor Ct may vary. A multi-level bit program operation may be possible using above-described characteristics.

A structural example of a specific semiconductor memory device having the circuit of FIG. 1A will be described.

Figure 2:
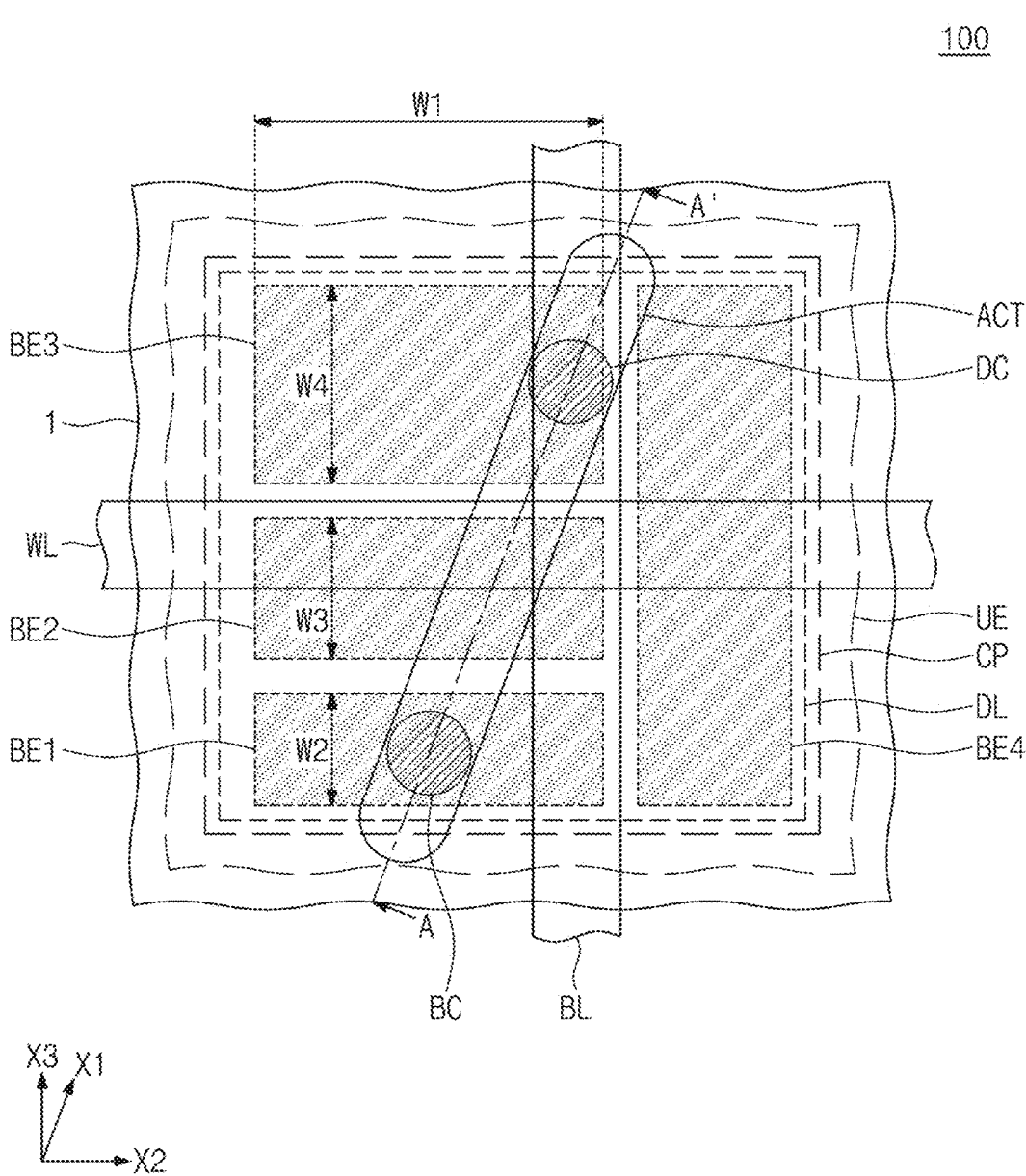
FIG. 2 is a plan view of a semiconductor memory device according to embodiments of the present disclosure.
Figure 3:
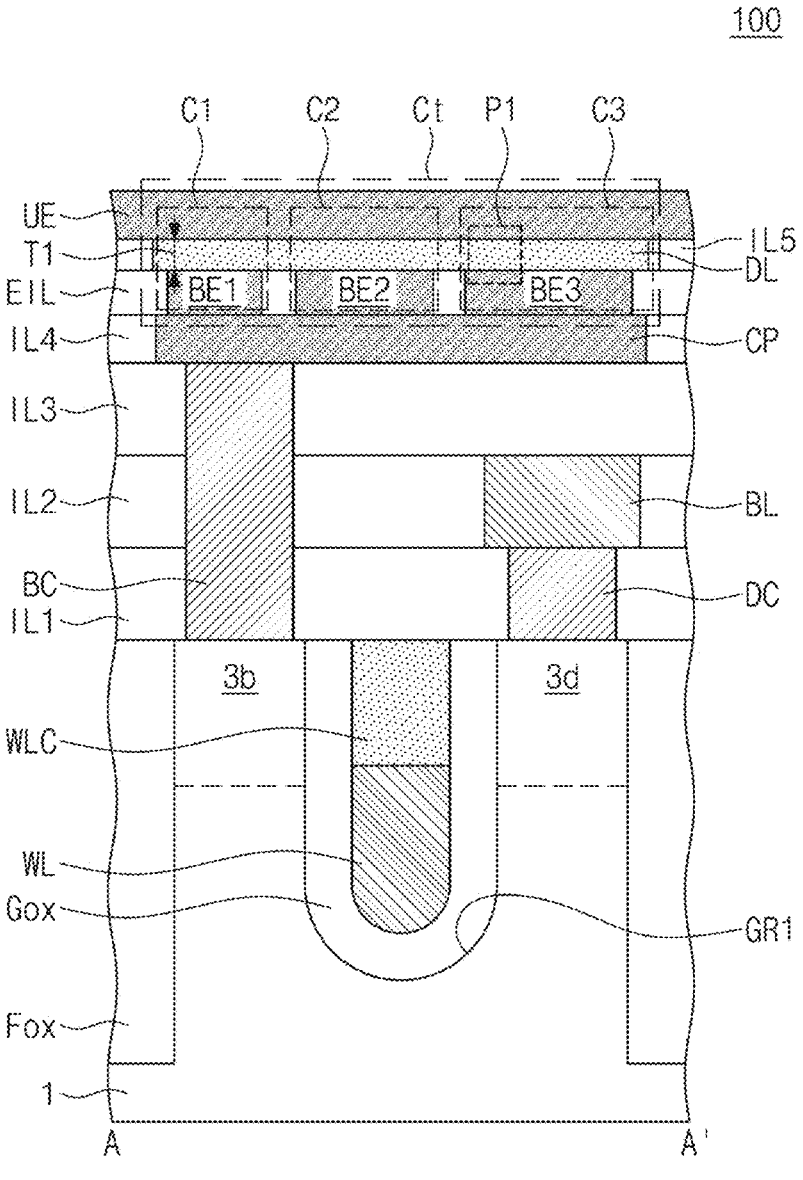
FIG. 3 is a cross-sectional view of the semiconductor memory device of FIG. 2 taken along line A-A' according to embodiments of the present disclosure.

FIG. 2 is a plan view of a semiconductor memory device according to embodiments of the present disclosure. FIG. 3 is a cross-sectional view of the semiconductor memory device of FIG. 2 taken along line A-A' according to embodiments of the present disclosure.

Referring to FIGS. 2 and 3, in a semiconductor memory device 100 according to the present example, a device isolation portion Fox is disposed on a substrate 1 to define an active portion ACT. The active portion ACT may have a bar shape elongated in a first direction X1 when viewed in a plan view. The substrate 1 may include a semiconductor material. The device isolation portion Fox may include, for example a single layer or multilayer structure of at least one of silicon oxide, silicon oxynitride, and silicon nitride.

A word line WL may cross the active part ACT. The word line WL may be disposed in a groove GR1 formed in the device isolation portion Fox and the active portion ACT. The word line WL may be parallel to a second direction X2 crossing the first direction X1. The word line WL may be formed of a conductive material. A gate insulating layer Gox may be disposed between the word line WL and an inner surface of the groove GR1. The gate insulating layer Gox may include, for example, a single layer structure or a multilayer structure of at least one of silicon oxide, silicon nitride, silicon oxynitride, and metal oxide.

Although not shown, a bottom of the groove GR1 may be relatively deep in the device isolation portion Fox and relatively shallow in the active part ACT. A lower surface of the word line WL may be curved. The gate insulating layer Gox may include at least one of a thermal oxide, silicon nitride, silicon oxynitride, and a high dielectric material, and preferably may include a thermal oxide.

A first impurity region 3d may be disposed in the active part ACT on one side of the word line WL, and a second impurity region 3b may be disposed in the active part ACT on the other side of the word line WL. The first and second impurity regions 3d and 3b may be doped with, for example, N-type impurities. The first impurity region 3d may correspond to a drain region and the second impurity region 3b may correspond to a source region. The word line WL and the first and second impurity regions 3d and 3b adjacent thereto may constitute the transistor TR of FIG. 1A. As the word line WL is disposed in the grooves GR1, a channel length of a channel region under the word line WL may be increased within a limited planar area. Therefore, a short-channel effect and the like may be minimized.

A word line capping pattern WLC may be disposed on the word line WL. The word line capping pattern WLC may have a line shape extending in a length direction of the word line WL and may cover the entire upper surface of the word line WL. The word line capping pattern WLC may fill the grooves GR1 on the word lines WL. The word line capping pattern WLC may be formed of, for example, a silicon nitride layer.

A first interlayer insulating layer IL1 may cover the substrate 1, the word line capping pattern WLC, and the device isolation portion Fox. A bit line BL is disposed on the first interlayer insulating layer IL1. When viewed in a plan view, the bit line BL may cross the word line capping pattern WLC and the word lines WL. As disclosed in FIG. 2, the bit line BL may be parallel to a third direction X3 crossing the first and second directions X1 and X2. The bit line BL may have a single layer or multilayer structure of at least one of impurity-doped polysilicon, metal silicide, metal nitride, and metal. A bit line contact DC is disposed in the first interlayer insulating layer IL1 to connect the first impurity region 3d and the bit line BL. The bit line contact DC may have a single-layer structure or a multi-layer structure of at least one of impurity-doped polysilicon, metal silicide, metal nitride, and metal. At least a portion of the bit line contact DC may be integrally formed with the bit line BL.

Second and third interlayer insulating layers IL2 and IL3 may be sequentially stacked on the first interlayer insulating layer IL1. The bit line BL is disposed in the second interlayer insulating layer IL2. A conductive pattern CP is disposed on the third interlayer insulating layer IL3. The conductive pattern CP may overlap the bit line BL, the word line WL, and the first and second impurity regions 3d and 3b when viewed in a plan view. The conductive pattern CP may include, for example, a single or multilayer structure of at least one of metals such as aluminum, tungsten, and copper, metal oxides such as $InO_2$, $InSnO_2$, RuO, and $IrO_2$, metal nitrides such as TiN, CrN, NbN, and MON, noble metals such as Ir, Pt, Au, and Ag.

A storage node contact BC passes through the first to third interlayer insulating layers IL1 to IL3 and connects the conductive pattern CP to the second impurity region 3b. The storage node contact BC may have a single layer structure or a multilayer structure of at least one of impurity-doped polysilicon, metal silicide, metal nitride, and metal.

First to fourth partial electrodes BE1 to BE4 are disposed on the conductive pattern CP. The first to fourth partial electrodes BE1 to BE4 may be spaced apart from each other, and a space therebetween may be filled with an inter-electrode insulating layer EIL. Areas (planar areas) of upper surfaces of the first to fourth partial electrodes BE1 to BE4 may be different from each other. For example, the first to third partial electrodes BE1 to BE3 may have the same first width W1 in the second direction X2, and may have second to fourth widths W2 to W4 different from each other in the third direction X3. A planar area of the second partial electrode BE2 may be greater than a planar area of the first partial electrode BE1 and may be smaller than a planar area of the third partial electrode BE3. In this case, the third width W3 of the second partial electrode BE2 in the third direction X3 may be greater than the second width W2 of the first partial electrode BE1, and may be smaller than the fourth width W4 of the third partial electrode BE3. The inter-electrode insulating layer EIL may have a single layer or multilayer structure of at least one of silicon oxide, silicon nitride, and silicon oxynitride. An air gap region may exist in the inter-electrode insulating layer EIL.

A dielectric layer DL is disposed on the first to fourth partial electrodes BE1 to BE4. The dielectric layer DL is in contact with all upper surfaces of the first to fourth partial electrodes BE1 to BE4. The dielectric layer DL may be in contact with an upper surface of the inter-electrode insulating layer EIL between the first to fourth partial electrodes BE1 to BE4. The dielectric layer DL may include a single layer structure or a multilayer structure of at least one of a ferroelectric material and an antiferroelectric material. The ferroelectric material is at least one of $HfO_2$, $ZrO_2$, $Hf_xZr_{1-x}O_2$, $BaTiO_3$, $SrTiO_3$, and $Sr_xBa_{1-x}TiO_3$, and the antiferroelectric material is at least one of $ZrO_2$, $Hf_yZr_{1-y}O_2$, $PbZrO_3$, and $AgNbO_3$, where 'x' is 0.5 or more and 'y' may be less than 0.5. The dielectric layer DL may have a first thickness T1. The first thickness T1 may be 30 Å to 100 Å.

Figure 4:
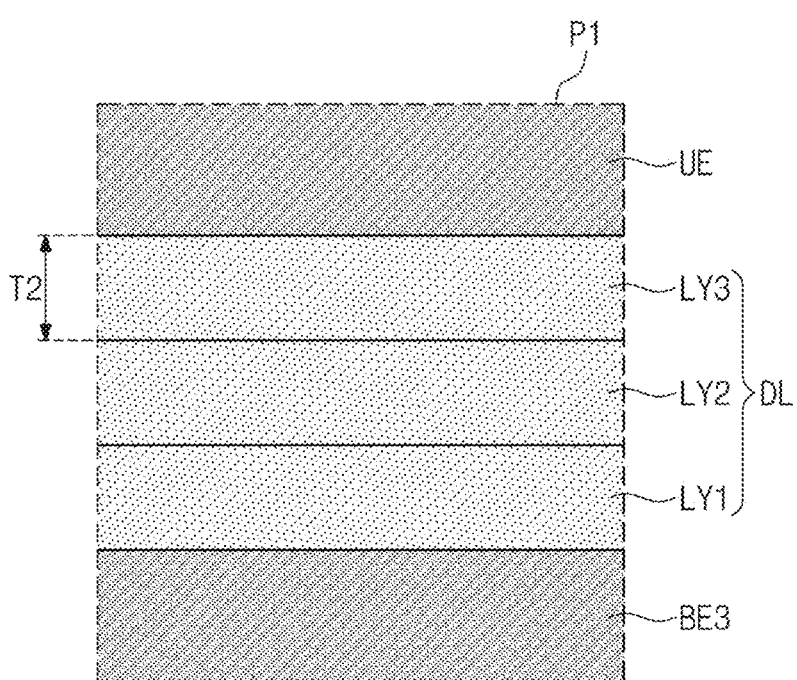
FIG. 4 is an enlarged view of 'P1' of FIG. 3 according to embodiments of the present disclosure.

FIG. 4 is an enlarged view of 'P1' of FIG. 3 according to embodiments of the present disclosure. Referring to FIG. 4, the dielectric layer DL may include a plurality of sub-dielectric layers LY1 to LY3 sequentially stacked. For example, the sub-dielectric layers LY1 to LY3 may include first to third sub-dielectric layers LY1 to LY3. In this example, the sub-dielectric layers LY1 to LY3 are illustrated as three layers, but it is not limited thereto, and the number of the sub-dielectric layers LY1 to LY3 may be two, four or more. At least one of the sub-dielectric layers LY1 to LY3 may have at least a second thickness T2. The second thickness T2 may be 5 Å to 30 Å. Each of the sub-dielectric layers LY1 to LY3 may independently include a ferroelectric material or an antiferroelectric material. At least one of the sub-dielectric layers LY1 to LY3 may be referred to as a 'ferroelectric layer'. At least one of the sub-dielectric layers LY1 to LY3 may be referred to as an 'antiferroelectric layer'. For example, the first sub-dielectric layer LY1 may be a first ferroelectric layer. The second sub-dielectric layer LY2 may be a first antiferroelectric layer. The third sub-dielectric layer LY3 may be a second ferroelectric layer.

A side surface of the dielectric layer DL may be covered with a fifth interlayer insulating layer IL5. The first to fifth interlayer insulating layers IL1 to IL5 may each independently have a single layer or multilayer structure of at least one of silicon oxide, silicon nitride, silicon oxynitride, and porous insulator. A common electrode UE may be disposed on the dielectric layer DL. The common electrode UE may have a single layer structure or a multilayer structure of at least one of impurity-doped polysilicon, metal silicide, metal nitride, and metal. The common electrode UE may overlap the dielectric layer DL and the first to fourth partial electrodes BE1 to BE4.

The first partial electrode BE1, a portion of the dielectric layer DL disposed thereon, and a portion of the common electrode UE may constitute a first sub-capacitor C1. The second partial electrode BE2, a portion of the dielectric layer DL disposed thereon, and a portion of the common electrode UE may constitute the second sub-capacitor C2. The third partial electrode BE3, a portion of the dielectric layer DL disposed thereon, and a portion of the common electrode UE may constitute a third sub-capacitor C3. The fourth partial electrode BE4, a portion of the dielectric layer DL disposed thereon, and a portion of the common electrode UE may constitute a fourth sub-capacitor C4.

Planar areas of the first to fourth partial electrodes BE1 to BE4 are different from each other. Therefore, as described with reference to FIG. 1B, during a program operation of the memory cell MC, a strength of an electric field applied to the dielectric layer DL of each of the sub-capacitors C1 to C4 may vary. As the planar areas of the first to fourth partial electrodes BE1 to BE4 decrease, the strength of the electric field increases, and thus possibility that a polarization direction of the ferroelectric material and/or antiferroelectric material in the dielectric layer DL disposed thereon is changed increases. Accordingly, as the polarization increases, the capacitance may increase or decrease. As a result, the capacitance of each of the sub-capacitors C1 to C4 may change and the total capacitance of the capacitor Ct may change. A multi-level bit program operation may be possible using the above-described characteristics.

In the semiconductor memory device according to the present disclosure, the ferroelectric and/or antiferroelectric material is used for the dielectric layer DL of the capacitor Ct, and thus the capacitance may be increased compared to a conventional dielectric layer. As a result, the area occupied by the capacitor may be reduced, thereby providing a highly integrated semiconductor memory device. In addition, in the semiconductor memory device according to the present disclosure, both the partial electrode and the common electrode of the capacitor are formed in a flat plate shape, and there is no need to form a conventional pillar or cylinder shape partial electrode, and thus a manufacturing process is simple and easy to implement.

Figure 5:
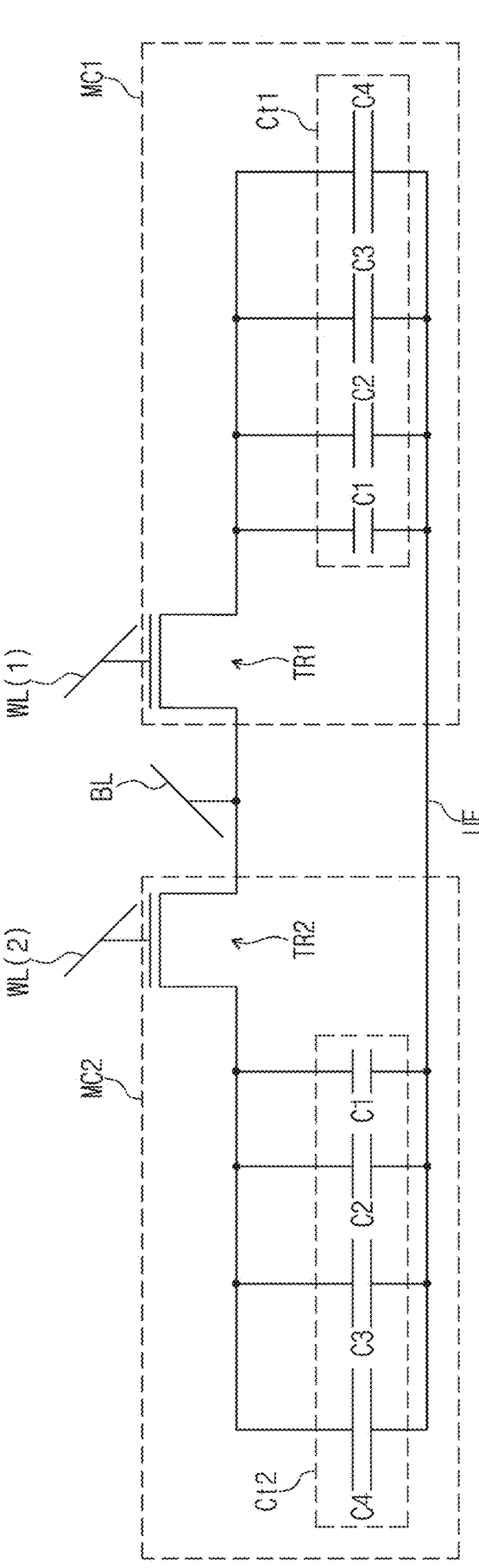
FIG. 5 is a circuit diagram of a semiconductor memory device according to embodiments of the present disclosure.

FIG. 5 is a circuit diagram of a semiconductor memory device according to embodiments of the present disclosure.

Referring to FIG. 5, in a semiconductor memory device according to the present example, two memory cells MC1 and MC2 may share one bit line BL. The first memory cell MC1 includes a first transistor TR1 and a first capacitor Ct1 connected to one terminal thereof. A gate of the first transistor TR1 is connected to a first word line WL(1). The second memory cell MC2 has a second transistor TR2 and a second capacitor Ct2 connected to one terminal thereof. A gate of the second transistor TR2 is connected to a second word line WL(2). Each of the first and second capacitors Ct1 and Ct2 includes a plurality of sub-capacitors C1 to C4. Capacitance of each of the sub-capacitors C1 to C4 is different from each other.

Figure 6:
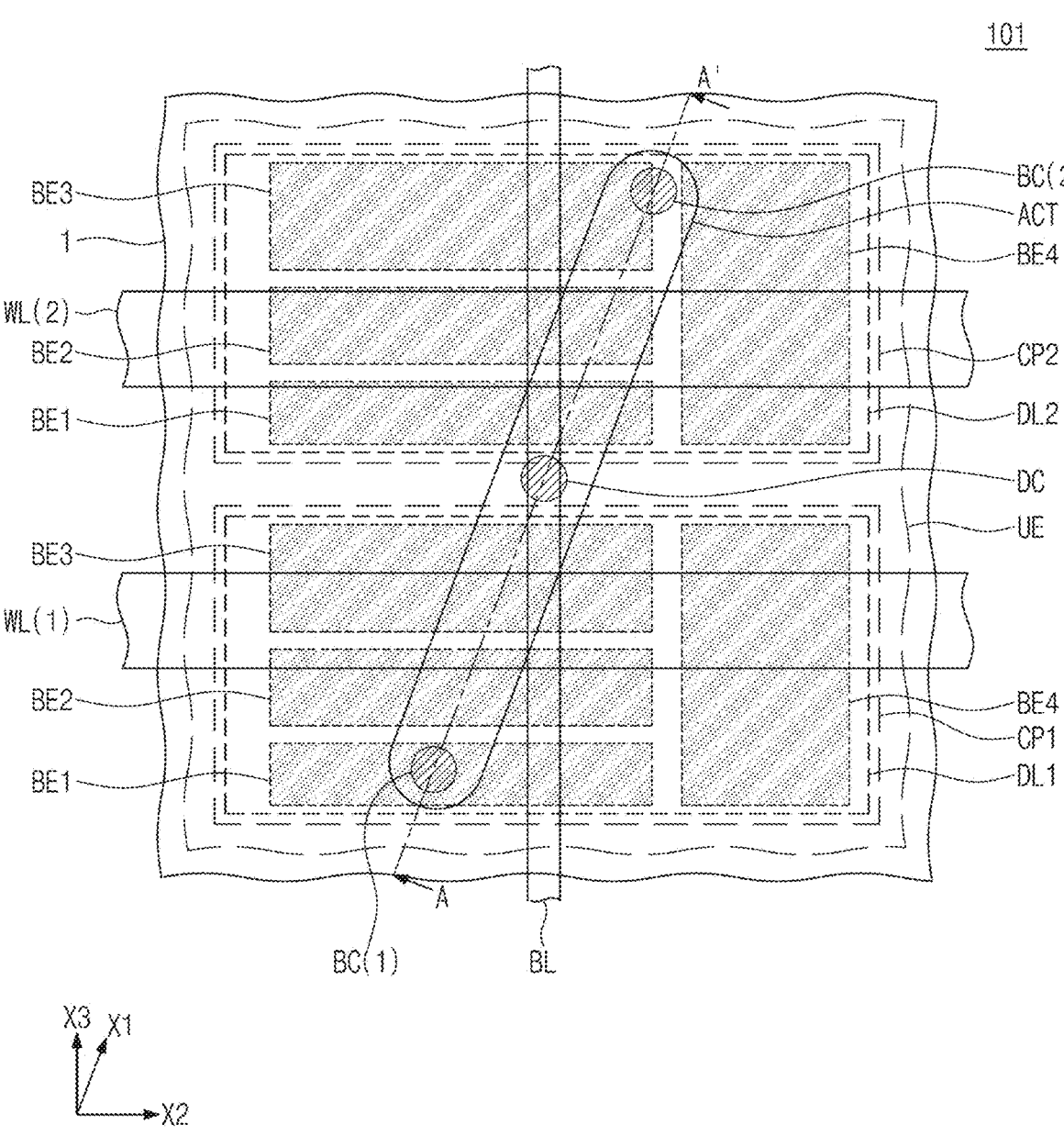
FIG. 6 is a plan view of a semiconductor memory device according to embodiments of the present disclosure.
Figure 7:
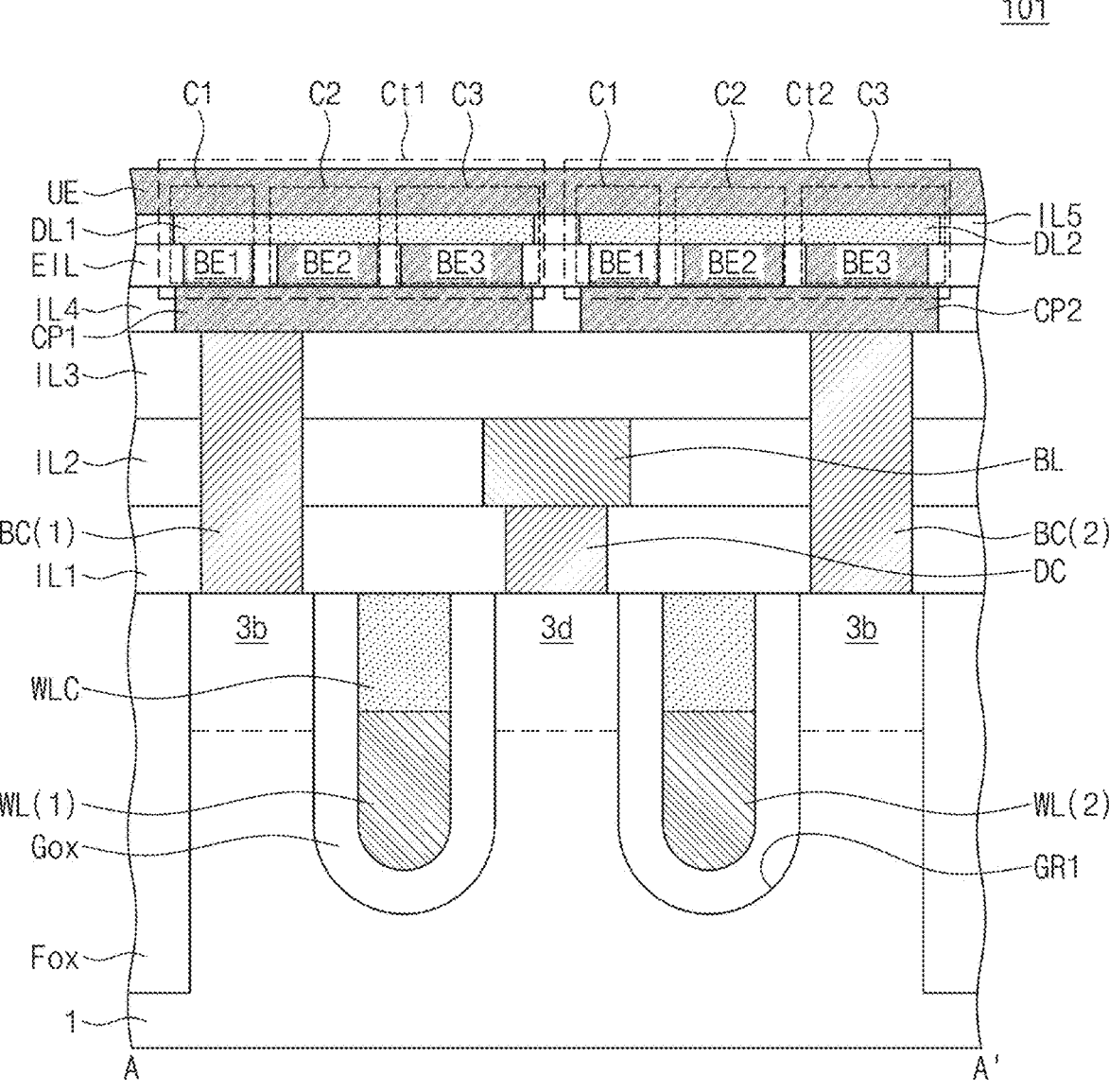
FIG. 7 is a cross-sectional view of FIG. 6 taken along line A-A'.

FIG. 6 is a plan view of a semiconductor memory device according to embodiments of the present disclosure. FIG. 7 is a cross-sectional view of FIG. 6 taken along line A-A'.

Referring to FIGS. 6 and 7, in a semiconductor memory device 101 according to the present example, a device isolation portion Fox is disposed on a substrate 1 to define an active portion ACT. The active portion ACT may have a bar shape elongated in a first direction X1 when viewed in a plan view.

Two word lines WL(1) and WL(2) may cross the active portion ACT. A first impurity region 3d is disposed in the active part ACT between the word lines WL(1) and WL(2), and second impurity regions 3b are disposed at both edges of the active part ACT. The first word line WL(1) and the first and second impurity regions 3d and 3b disposed on both sides of the first word line WL(1) may constitute the first transistor TR1 of FIG. 5. The second word line WL(2) and the first and second impurity regions 3d and 3b disposed on both sides of the second word line WL(2) may constitute the second transistor TR2 of FIG. 5.

A first conductive pattern CP1 and a second conductive pattern CP2 are disposed on a third interlayer insulating layer IL3. A fourth interlayer insulating layer IL4 is disposed between the first conductive pattern CP1 and the second conductive pattern CP2. A first storage node contact BC(1) penetrates the first to third interlayer insulating layers IL1 to IL3 and connects the first conductive pattern CP1 to one of the second impurity regions 3b. The second storage node contact BC(2) penetrates the first to third interlayer insulating layers IL1 to IL3 and connects the second conductive pattern CP2 and the other one of the second impurity regions 3b. First to fourth partial electrodes BE1 to BE4 may be disposed on the first storage node contact BC(1) and the second storage node contact BC(2), respectively. Upper surfaces of the first to fourth partial electrodes BE1 to BE4 on the first conductive pattern CP1 are in contact with the first dielectric layer DL1. Upper surfaces of the first to fourth partial electrodes BE1 to BE4 on the second conductive pattern CP2 are in contact with the second dielectric layer DL2. A fifth interlayer insulating layer IL5 may be interposed between the first and second dielectric layers DL1 and DL2. A common electrode UE may be disposed on the first and second dielectric layers DL1 and DL2. The common electrode UE is also disposed on the fifth interlayer insulating layer IL5.

The first to fourth partial electrodes BE1 to BE4 connected to the first storage node contact BC(1), the first dielectric layer DL1, and a portion of the common electrode UE thereon may constitute a first capacitor Ct1. The first to fourth partial electrodes BE1 to BE4 connected to the second storage node contact BC(2), the second dielectric layer DL2, and another portion of the common electrode UE thereon may constitute a second capacitor Ct2. In this example, the first dielectric layer DL1 of the first capacitor Ct1 may be separated from the second dielectric layer DL2 of the second capacitor Ct2, but the first dielectric layer DL1 may be connected to the second dielectric layer DL2. Accordingly, the fifth interlayer insulating layer IL5 may not be interposed between the first and second dielectric layers DL1 and DL2. Other configurations may be the same/similar to those described above.

Figure 8:
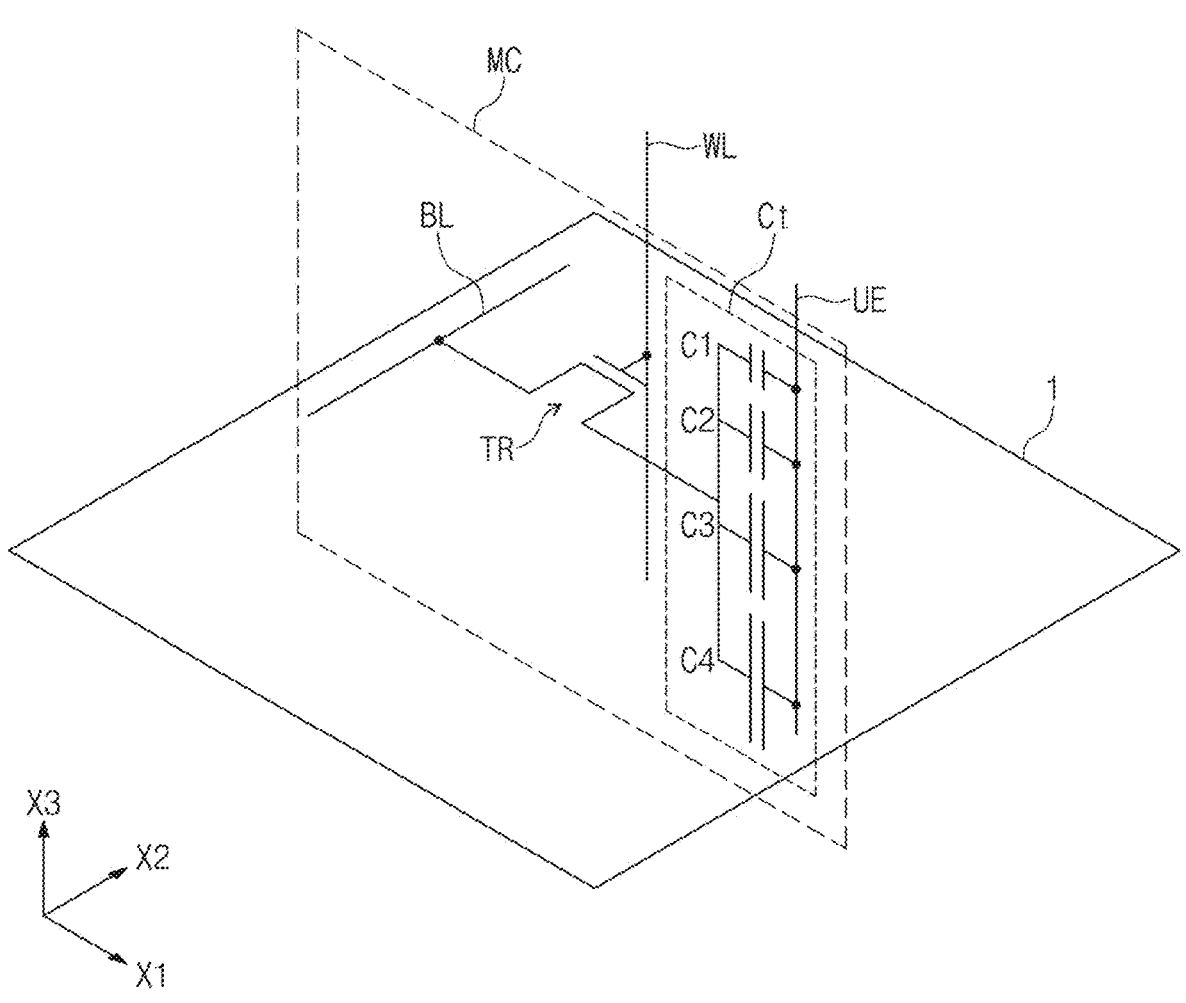
FIG. 8 is a circuit diagram of a semiconductor memory device according to embodiments of the present disclosure.

FIG. 8 is a circuit diagram of a semiconductor memory device according to embodiments of the present disclosure.

Referring to FIG. 8, a semiconductor memory device according to the present example may have the same circuit structure as that of FIG. 1A, but may have a different arrangement direction. In detail, a channel region of a transistor TR may extend in a first direction X1 parallel to an upper surface of the substrate 1. A bit line BL is parallel to the upper surface of the substrate 1 and extends in a second direction X2 crossing the first direction X1. A word line WL and a common electrode UE may extend in a third direction X3 perpendicular to the upper surface of the substrate 1. The memory cells MC of FIG. 8 may be symmetrically and/or repeatedly arranged in the first to third directions X1 to X3. Sub-capacitors C1 to C4 may be arranged in a direction opposite to the third direction X3.

Figure 9:
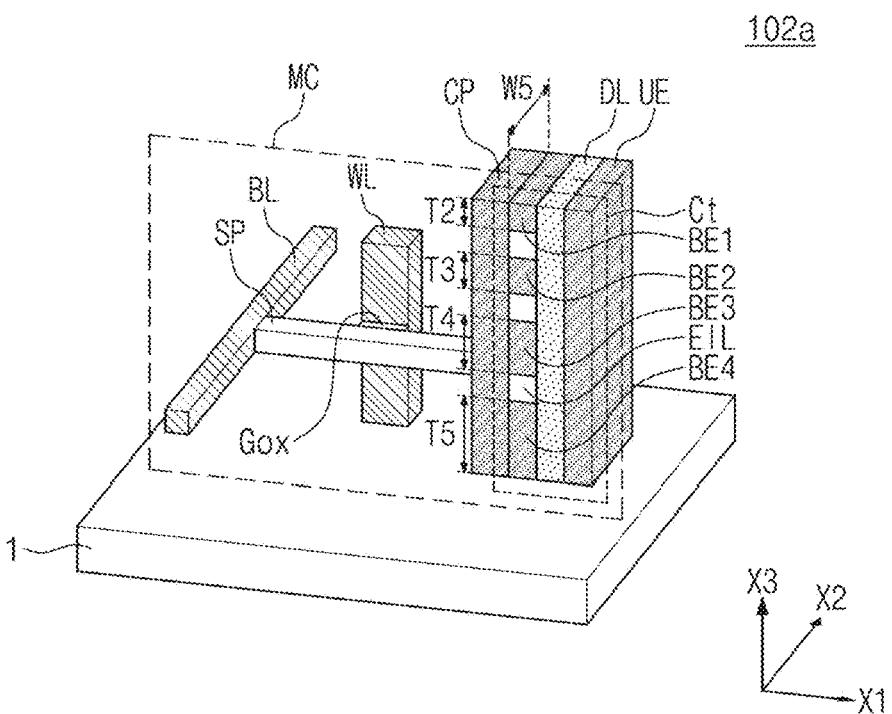
FIG. 9 is a perspective view of a semiconductor memory device according to embodiments of the present disclosure.

FIG. 9 is a perspective view of a semiconductor memory device according to embodiments of the present disclosure.

Referring to FIG. 9, a memory cell MC of a semiconductor memory device 102a according to the present example includes a semiconductor pattern SP disposed on a substrate 1. The substrate 1 may be formed of a semiconductor material such as silicon or an insulating material. The semiconductor pattern SP may have a bar shape elongated in a first direction X1 parallel to an upper surface of the substrate 1. In this example, the semiconductor pattern SP may be a silicon, germanium, oxide semiconductor material, or a two dimensional semiconductor material. Preferably, the semiconductor pattern SP may be an oxide semiconductor material. The oxide semiconductor material may include at least one of indium (In), gallium (Ga), zinc (Zn), and tin (Sn). The oxide semiconductor material may be indium-gallium-zinc-oxide (IGZO) containing indium (In), gallium (Ga), and zinc (Zn). The two-dimensional semiconductor material may include a transition metal and a chalcogen element. The transition metal may be, for example, tungsten (W) or molybdenum (Mo). The chalcogen element may be, for example, sulfur (S), selenium (Se) or tellurium (Te). The two-dimensional semiconductor material may be $MoS_2$, $WS_2$, $MoSe_2$ or $WSe_2$.

A word line WL is disposed adjacent to a center of the semiconductor pattern SP. A gate insulating layer Gox is interposed between the word line WL and the semiconductor pattern SP. The word line WL may extend in a third direction X3 perpendicular to the upper surface of the substrate 1. One end of the semiconductor pattern SP may be connected to a bit line BL. The bit line BL may extend in a second direction X2 parallel to the upper surface of the substrate 1.

A conductive pattern CP is connected to the other end of the semiconductor pattern SP. The conductive pattern CP may extend in the third direction X3. A capacitor Ct is connected to the conductive pattern CP. In detail, side surfaces of the conductive pattern CP are in contact with first to fourth partial electrodes BE1 to BE4. The first to fourth partial electrodes BE1 to BE4 may be sequentially arranged in a direction opposite to the third direction X3. An inter-electrode insulating layer EIL may be interposed between the first to fourth partial electrodes BE1 to BE4. Side surfaces of the first to fourth partial electrodes BE1 to BE4 are in contact with a dielectric layer DL. A side surface of the dielectric layer DL is in contact with the common electrode UE. The dielectric layer DL and the common electrode UE may extend in the third direction X3.

Areas of side surfaces of the first to fourth partial electrodes BE1 to BE4 contacting the dielectric layer DL may be different from each other. For example, the first to fourth partial electrodes BE1 to BE4 may have the same fifth width W5 in the second direction X2. However, the first to fourth partial electrodes BE1 to BE4 may have different thicknesses T2 to T5 in the third direction X3. For example, the first partial electrode BE1 may have a second thickness T2. The second partial electrode BE2 may have a third thickness T3. The third partial electrode BE3 may have a fourth thickness T4. The fourth partial electrode BE4 may have a fifth thickness T5. The third thickness T3 may be larger than the second thickness T2 and smaller than the fourth thickness T4. The fifth thickness T5 may be greater than the fourth thickness T4.

Figure 10:
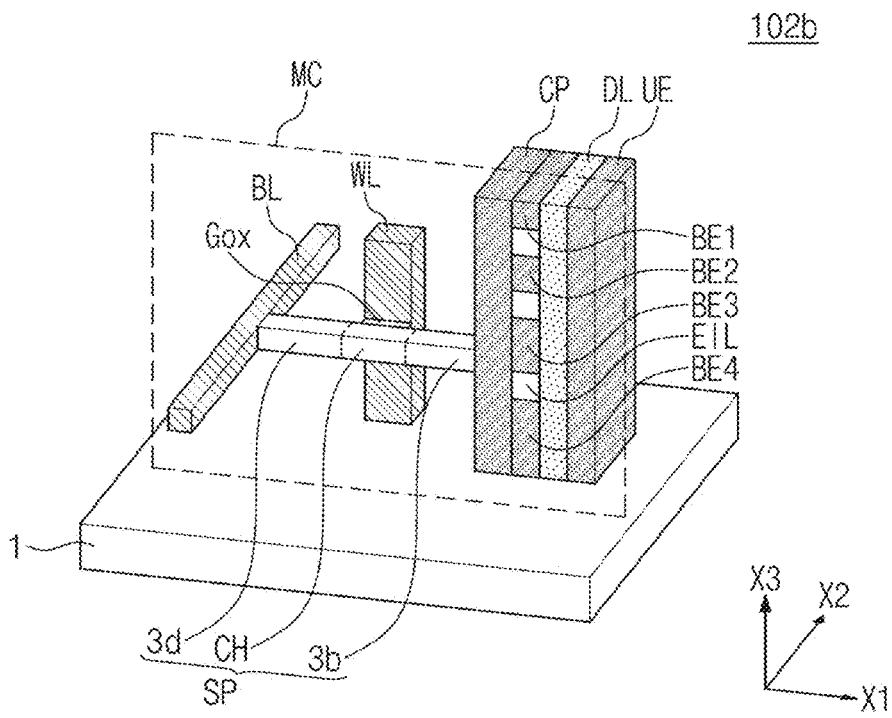
FIG. 10 is a perspective view of a semiconductor memory device according to embodiments of the present disclosure.

FIG. 10 is a perspective view of a semiconductor memory device according to embodiments of the present disclosure.

Referring to FIG. 10, in a semiconductor memory device 102b according to the present example, a semiconductor pattern SP may include a channel region CH and first and second impurity regions 3d and 3b on both sides of the channel region CH. The semiconductor pattern SP may be formed of, for example, silicon. The channel region CH may be doped with impurities of a first conductivity type. The first and second impurity regions 3d and 3b may be doped with impurities of a second conductivity type opposite to the first conductivity type. The first impurity region 3d is in contact with a bit line BL. The second impurity region 3b is in contact with a conductive pattern CP. Other configurations may be the same/similar to those described with reference to FIG. 9.

Figure 11:
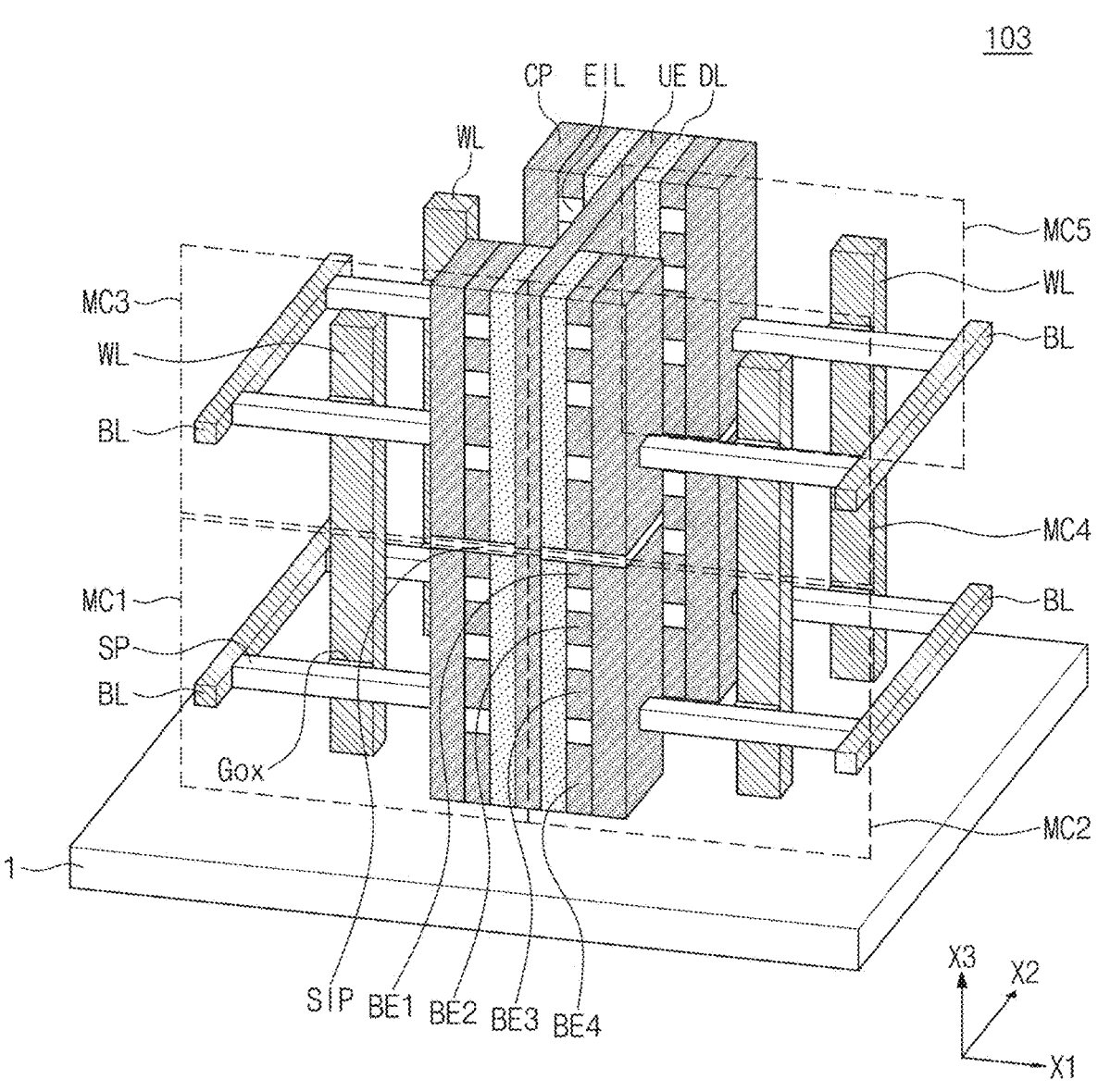
FIG. 11 is a perspective view of a semiconductor memory device according to embodiments of the present disclosure.

FIG. 11 is a perspective view of a semiconductor memory device according to embodiments of the present disclosure.

Referring to FIG. 11, a semiconductor memory device 103 according to the present embodiment has a memory cell array structure in which the memory cells MC of FIG. 9 are repeatedly and/or symmetrically disposed in first to third directions X1 to X3. In detail, a first memory cell MC1 and a second memory cell MC2 may be arranged in the first direction X1 to have a mirror-symmetrical shape. A third memory cell MC3 may be disposed on the first memory cell MC1 and may share a word line WL with each other. A fourth memory cell MC4 may be disposed on the second memory cell MC2 and may share the word line WL with each other. A fifth memory cell MC5 may be disposed behind the fourth memory cell MC4 and may share a bit line BL with each other.

A separation insulation pattern SIP may be interposed between a conductive pattern CP of the first memory cell MC1 and a conductive pattern CP of the third memory cell MC3. The separation insulating pattern SIP may be interposed between a first partial electrode BE1 of the first memory cell MC1 and a fourth partial electrode BE4 of the third memory cell MC3, and between dielectric layers DL of the first memory cell MC1 and the third memory cell MC3. A common electrode UE may extend in second and third directions X2 and X3. The common electrode UE may be commonly shared with the memory cells MC1 to MC5. Other configurations may be the same/similar to those described above.

In the semiconductor memory device according to the present disclosure, the ferroelectric and/or antiferroelectric material may be used as the dielectric layer of the capacitor, thereby increasing the capacitance. Accordingly, the highly integrated semiconductor memory device may be provided. In addition, the both the partial electrode and the common electrode of the capacitor are formed in the flat plate shape, and thus the manufacturing process is simple and easy to implement. In addition, in the present disclosure, by making the interfacial areas of the partial electrodes that are in contact with the dielectric layer different from each other. Accordingly, it is possible to provide the semiconductor memory device having the various memory characteristics.

While embodiments are described above, a person skilled in the art may understand that many modifications and variations are made without departing from the spirit and scope of the present disclosure defined in the following claims. Accordingly, the example embodiments of the present disclosure should be considered in all respects as illustrative and not restrictive, with the spirit and scope of the present disclosure being indicated by the appended claims.

What is claimed is:

1. A semiconductor memory device comprising:
a substrate, the substrate including a first impurity region and a second impurity region;
a first word line in the substrate,
the first word line in a region of the substrate with the first impurity region on one side of the first word line and the second impurity region on an other side of the first word line;
a bit line connected to the first impurity region;
a first conductive pattern connected to the second impurity region;
a first partial electrode and a second partial electrode on the first conductive pattern;
a first dielectric layer in contact with an upper surface of the first partial electrode and an upper surface of the second partial electrode; and
a common electrode on the first dielectric layer, wherein an area of the upper surface of the first partial electrode is different from an area of the upper surface of the second partial electrode.

2. The semiconductor memory device of claim 1, wherein the first dielectric layer includes a single layer structure or a multilayer structure of at least one of a ferroelectric material and an antiferroelectric material.

3. The semiconductor memory device of claim 2, wherein the ferroelectric material includes one of $HfO_2$, $ZrO_2$, $Hf_xZr_{1-x}O_2$, $BaTiO_3$, $SrTiO_3$, and $Sr_xBa_{1-x}TiO_3$,
the antiferroelectric material includes one of $ZrO_2$, $Hf_yZr_{1-y}O_2$, $PbZrO_3$, and $AgNbO_3$,
the 'x' is greater than or equal to 0.5, and
the 'y' is less than 0.5.

4. The semiconductor memory device of claim 2, wherein a thickness of the first dielectric layer is 30 Å to 100 Å.

5. The semiconductor memory device of claim 2, wherein the first dielectric layer includes a first ferroelectric layer and a second antiferroelectric layer,
the first ferroelectric layer and the second antiferroelectric layer are sequentially stacked, and
a thickness of the first ferroelectric layer or a thickness of the second antiferroelectric layer is 5 Å to 30 Å.

6. The semiconductor memory device of claim 1, further comprising:
an inter-electrode insulating layer filling a space between the first partial electrode and the second partial electrode, wherein
the inter-electrode insulating layer is in contact with the first dielectric layer.

7. The semiconductor memory device of claim 1, further comprising:
a third partial electrode on the first conductive pattern, wherein
the third partial electrode is spaced apart from the first partial electrode and the second partial electrode,
an upper surface of the third partial electrode is in contact with the first dielectric layer, and an area of the upper surface of the third partial electrode is different from the area of the upper surface of the first partial electrode and the area of the upper surface of the second partial electrode.

8. The semiconductor memory device of claim 1, further comprising:

a second word line in the substrate and spaced apart from the first word line, the second word line being in a part of the substrate with the first impurity region between the first word line and the second word line and a third impurity region in the substrate at one side of the second word line;

a second conductive pattern connected to the third impurity region;

a third partial electrode and a fourth partial electrode on the second conductive pattern; and a second dielectric layer in contact with an upper surface of the third partial electrode and an upper surface of the fourth partial electrode, wherein an area of the upper surface of the third partial electrode is different from an area of the upper surface of the fourth partial electrode, and the common electrode covers the second dielectric layer.

9. The semiconductor memory device of claim 1, wherein the first conductive pattern, the first dielectric layer, and the common electrode overlap the first word line and the bit line.

10. A semiconductor memory device comprising:

a substrate;

a transistor on the substrate;

a bit line connected to a first side of the transistor; and a capacitor connected to a second side of the transistor, wherein the capacitor includes a plurality of partial electrodes, a dielectric layer in contact with the plurality of partial electrodes, and a common electrode in contact with the dielectric layer, areas of the plurality of partial electrodes in contact with the dielectric layer are different from each other, and the dielectric layer includes a single layer structure or a multilayer structure of at least one of a ferroelectric material and an antiferroelectric material.

11. The semiconductor memory device of claim 10, wherein the transistor includes:

a word line in the substrate, the substrate including impurity regions in the substrate on both sides of the word line; and a gate insulating layer between the word line and the substrate.

12. The semiconductor memory device of claim 11, wherein the bit line is on the substrate and crosses the word line, and the capacitor is on the bit line.

13. The semiconductor memory device of claim 11, further comprising:

a conductive pattern connecting the plurality of partial electrodes, wherein the conductive pattern is spaced apart from the dielectric layer.

14. The semiconductor memory device of claim 10, wherein the transistor includes:

a semiconductor pattern on the substrate, the semiconductor pattern having a bar shape extending in a first direction parallel to an upper surface of the substrate;

a word line adjacent to a center of the semiconductor pattern, the word line extending in a second direction, the second direction being perpendicular to the upper surface of the substrate; and a gate insulating layer between the word line and the semiconductor pattern.

15. The semiconductor memory device of claim 14, wherein the semiconductor pattern includes impurity regions at both ends of the semiconductor pattern.

16. The semiconductor memory device of claim 14, wherein the bit line extends in a third direction, the bit line is in contact with a first end of the semiconductor pattern, the third direction is parallel to an upper surface of the substrate, the third direction crosses the first direction, and the capacitor is connected to a second end of the semiconductor pattern.

17. The semiconductor memory device of claim 16, further comprising:

a conductive pattern in contact with the second end of the semiconductor pattern, the conductive pattern connects the plurality of partial electrodes, and the conductive pattern is spaced apart from the dielectric layer.

18. The semiconductor memory device of claim 17, wherein the conductive pattern is parallel to the second direction.

19. A semiconductor memory device comprising:

a substrate including an active region, a first impurity region, and a second impurity region;

a device isolation portion on the substrate, the device isolation portion defining an active region of the substrate;

a word line crossing the active region, the word line in a region of the substrate with the first impurity region at one side of the word line and the second impurity region at an other side of the word line;

a first interlayer insulating layer covering the substrate;

a bit line on the first interlayer insulating layer and connected to the first impurity region;

a second interlayer insulating layer covering the bit line and the first interlayer insulating layer;

a first conductive pattern on the second interlayer insulating layer and connected to the second impurity region;

a first partial electrode and a second partial electrode on the first conductive pattern;

an inter-electrode insulating layer between the first partial electrode and the second partial electrode;

a dielectric layer in contact with an upper surface of the first partial electrode, an upper surface of the second partial electrode, and an upper surface of the inter-electrode insulating layer; and a common electrode on the dielectric layer, wherein an area of the upper surface of the first partial electrode is different from an area of the upper surface of the second partial electrode, a thickness of the dielectric layer is 30 Å to 100 Å, and the dielectric layer includes a single layer structure or a multilayer structure of at least one of a ferroelectric material and an antiferroelectric material.

20. The semiconductor memory device of claim 19, further comprising:

a third partial electrode on the first conductive pattern, wherein the third partial electrode is spaced apart from the first partial electrode and the second partial electrode, an upper surface of the third partial electrode is in contact with the dielectric layer, and an area of the upper surface of the third partial electrode is different from the area of the upper surfaces of the first partial electrode and the area of the upper surface of the second partial electrode.

\*  \*  \*  \*  \*